(12) United States Patent
Park (10) Patent No.: US 7,718,520 B2
(45) Date of Patent: May 18, 2010

(54) SEMICONDUCTOR INTEGRATED CIRCUIT DEVICE AND RELATED METHOD

(75) Inventor: Hee-sook Park, Jung-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 549 days.

(21) Appl. No.: 11/723,725

(22) Filed: Mar. 21, 2007

(65) Prior Publication Data

US 2007/0221998 A1    Sep. 27, 2007

(30) Foreign Application Priority Data

Mar. 22, 2006   (KR)   ................... 10-2006-0026265

(51) Int. Cl.
*H01L 21/00* (2006.01)
(52) U.S. Cl. .................. 438/586; 438/592; 438/653
(58) Field of Classification Search ............... 438/592, 438/586, 653
See application file for complete search history.

(56) References Cited

U.S. PATENT DOCUMENTS

| 6,596,642 | B2 * | 7/2003 | Wu et al. | 438/705 |
|---|---|---|---|---|
| 6,596,648 | B2 * | 7/2003 | Wu et al. | 438/745 |
| 6,599,840 | B2 * | 7/2003 | Wu et al. | 438/705 |
| 6,630,710 | B1 * | 10/2003 | Augusto | 257/327 |
| 6,890,823 | B2 * | 5/2005 | Lee et al. | 438/300 |
| 7,148,097 | B2 * | 12/2006 | Yu et al. | 438/199 |
| 7,221,023 | B2 * | 5/2007 | Seo et al. | 257/347 |
| 7,229,871 | B2 * | 6/2007 | Yu et al. | 438/199 |
| 7,524,733 | B2 * | 4/2009 | Seo et al. | 438/418 |
| 7,566,603 | B2 * | 7/2009 | Yoon | 438/197 |
| 2004/0043595 | A1 * | 3/2004 | Lee et al. | 438/592 |
| 2007/0221998 | A1 * | 9/2007 | Park | 257/382 |
| 2007/0269974 | A1 * | 11/2007 | Park et al. | 438/618 |

FOREIGN PATENT DOCUMENTS

| JP | 09-321247 | 12/1997 |
|---|---|---|
| KR | 1020020060837 A | 7/2002 |
| KR | 1020050025508 A | 3/2005 |

* cited by examiner

*Primary Examiner*—Laura M Menz
(74) *Attorney, Agent, or Firm*—Volentine & Whitt, PLLC (57) ABSTRACT

Embodiments of the invention provide a semiconductor integrated circuit device and a method for fabricating the device. In one embodiment, the method comprises forming a plurality of preliminary gate electrode structures in a cell array region and a peripheral circuit region of a semiconductor substrate; forming selective epitaxial films on the semiconductor substrate in the cell array region and the peripheral region; implanting impurities into at least some of the selective epitaxial films to form elevated source/drain regions in the cell array region and the peripheral circuit region; forming a first interlayer insulating film; and patterning the first interlayer insulating film to form a plurality of first openings exposing the elevated source/drain regions. The method further comprises forming a first ohmic film, a first barrier film, and a metal film; and removing portions of each of the metal film, the first barrier film, and the first ohmic film.

15 Claims, 6 Drawing Sheets

SEMICONDUCTOR INTEGRATED CIRCUIT DEVICE AND RELATED METHOD

BACKGROUND

1. Field of the Invention

Embodiments of the invention relate to a semiconductor integrated circuit device and a related fabrication method. In particular, embodiments of the invention relate to a semiconductor integrated circuit device and a method for fabricating the manufacturing the semiconductor integrated circuit device in which contacts can be formed in a cell array region and a peripheral circuit region of a semiconductor substrate at the same time.

This application claims priority to Korean Patent Application No. 10-2006-0026265, filed on Mar. 22, 2006, the subject matter of which is hereby incorporated by reference in its entirety.

2. Description of Related Art

Self-aligned contacts formed in a cell array region of a semiconductor substrate have a different size, shape, and function than contacts formed in a peripheral circuit region and connected to a metal wire. In addition, self-aligned contacts formed in a cell array region are formed from a different type of conductive material than contacts formed in a peripheral circuit region and connected to a metal wire. Thus, contacts disposed in a cell array region of a semiconductor substrate and contacts disposed in a peripheral circuit region of a semiconductor substrate cannot be formed using a single process. In addition, as the design rule for semiconductor integrated circuit devices has been reduced, problems have arisen in the peripheral circuit region as well as the cell array region. Examples of such problems are difficulty acquiring the open margins required for the formation of contacts, increase in contact resistance resulting from the reduction in size of source/drain regions, and deterioration of the leakage current characteristic.

In addition, when polysilicon is used as a conductive material to form contacts in the peripheral circuit region on transistors that have different conductivities, processes for implanting different impurities should be performed. Thus, when forming those contacts in the peripheral circuit region, complicated processes for forming contacts (such as several photoresist processes) may need to be performed separately from the process for forming contacts in the cell array region.

SUMMARY

Embodiments of the invention provide a semiconductor integrated circuit device having reduced contact resistance and an improved electrical characteristic(s), and a method for fabricating the semiconductor integrated circuit device, wherein the method comprises a simpler process for forming contacts in a cell array region and a peripheral circuit region of a semiconductor substrate.

In one embodiment, the invention provides a method for fabricating a semiconductor integrated circuit device, wherein the method comprises forming a plurality of preliminary gate electrode structures in a cell array region and a peripheral circuit region of a semiconductor substrate, wherein each preliminary gate electrode structure comprises a gate electrode and a gate capping film formed on the gate electrode; forming first spacers on sidewalls of the preliminary gate electrode structures; and forming selective epitaxial films on the semiconductor substrate in the cell array region and the peripheral region, wherein each selective epitaxial film is formed on a region of the semiconductor substrate exposed between gate electrodes. The method further comprises implanting impurities into at least some of the selective epitaxial films to form elevated source/drain regions in the cell array region and the peripheral circuit region, thereby forming transistors in the cell array region and the peripheral circuit region; forming a first interlayer insulating film on the semiconductor substrate; and patterning the first interlayer insulating film to form a plurality of first openings exposing the elevated source/drain regions and self-aligned between gate electrodes. The method still further comprises forming a first ohmic film on the elevated source/drain regions exposed through the first openings; forming a first barrier film on the first ohmic film; forming a metal film on the first barrier film; and removing a first portion of the metal film, a first portion of the first barrier film, and a first portion of the first ohmic film to form a plurality of self-aligned contact pads, wherein each self-aligned contact pad is node-isolated and the first portion of the metal film comprises at least one second portion of the metal film disposed on at least one of the gate capping films.

In another embodiment, the invention provides a method for fabricating a semiconductor integrated circuit device, wherein the method comprises forming a plurality of preliminary gate electrode structures in a cell array region and a peripheral circuit region of a semiconductor substrate, wherein each preliminary gate electrode structure comprises a gate electrode and a gate capping film formed on the gate electrode; forming first spacers on sidewalls of the preliminary gate electrode structures; forming a first interlayer insulating film on the semiconductor substrate; and patterning the first interlayer insulating film to form a plurality of first openings exposing portions of the semiconductor substrate in the cell array region and the peripheral circuit region. The method further comprises forming selective epitaxial films on the portions of the semiconductor substrate exposed through the first openings; implanting impurities into the selective epitaxial films to form elevated source/drain regions, thereby forming transistors in the cell array region and the peripheral circuit region; and forming a first ohmic film on the elevated source/drain regions exposed through the first openings. The method still further comprises forming a first barrier film on the first ohmic film; forming a metal film on the first barrier film; and removing a first portion of the metal film, a first portion of the first barrier film, and a first portion of the first ohmic film to form a plurality of self-aligned contact pads, wherein each self-aligned contact pad is node-isolated, and the first portion of the metal film comprises at least one second portion of the metal film disposed on at least one of the gate capping films.

In still another embodiment, the invention provides a semiconductor integrated circuit device comprising a plurality of gate electrodes disposed on a cell array region and a peripheral circuit region of a semiconductor substrate; a plurality of gate capping films, wherein each of the gate capping films is disposed on one of the gate electrodes; and first spacers formed on sidewalls of the gate electrodes. The device further comprises a first interlayer insulating film disposed on the semiconductor substrate, wherein groups of the gate electrodes are disposed in each of a plurality of first openings of the first interlayer insulating film; elevated source/drain regions, wherein each elevated source/drain region is disposed in one of a plurality of selective epitaxial films disposed on the semiconductor substrate in one of the first openings; and a first ohmic film, wherein a plurality of portions of the first ohmic film are respectively disposed on at least some of the elevated source/drain regions. The device still further comprises a first barrier film, wherein a plurality of portions of the first barrier film are respectively disposed on the portions of the first ohmic film; and a plurality of self-aligned contact pads respectively disposed on the portions of the first barrier film, wherein each self-aligned contact pad comprises a metal material.

BRIEF DESCRIPTION OF THE DRAWINGS

Embodiments of the invention will be described herein with reference to the accompanying drawings in which like reference symbols indicate like or similar elements throughout. In the drawings.

DESCRIPTION OF EMBODIMENTS

As used herein, when a first element or layer is described as being "on," "connected to," or "coupled to" a second element or layer, the first element or layer may be directly on, directly connected to, or directly coupled to the second element or layer, or intervening elements and/or layers may be present. In contrast, when a first element or layer is described as being "directly on," "directly connected to," or "directly coupled to" a second element or layer, no intervening elements and/or layers are present. As used herein, the term "and/or" may indicate any combination of one or more of the listed items.

The illustrated embodiments of the invention will be described below with reference to drawings showing exemplary cross-sections of the illustrated embodiments. In practice, the actual shapes of elements illustrated in the drawings may deviate from the shapes shown in the drawings in accordance with manufacturing techniques and/or tolerances. Accordingly, the illustrated embodiments of the invention are not limited to specific shapes and/or configurations shown in the drawings, but rather incorporate deviations resulting from the method used to fabricate the semiconductor device. For example, an etched region illustrated as having a right angle may actually be formed having a rounded shape or a predetermined curvature without departing from the scope of the invention as defined by the accompanying claims. Therefore, elements illustrated in the drawings are to be interpreted as schematic in nature and their shapes are to be interpreted as only exemplary shapes for those elements.

FIGS. 1 to 8 are cross-sectional views illustrating a method for fabricating a semiconductor integrated circuit device in accordance with an embodiment of the invention.

Figure 1:
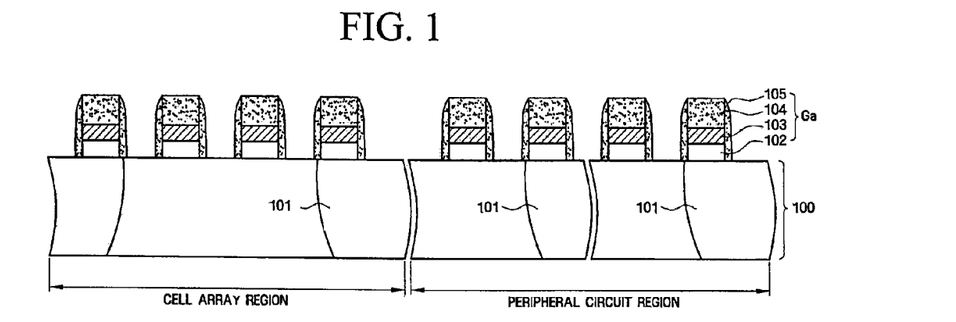
FIGS. 1 to 8 are cross-sectional views illustrating a method for fabricating a semiconductor integrated circuit device in accordance with an embodiment of the invention.

As shown in FIG. 1, a semiconductor substrate 100 comprises a cell array region and a peripheral circuit region. Semiconductor substrate 100 may be a silicon substrate, a SOI (Silicon On Insulator) substrate, a gallium arsenide substrate, a silicon germanium substrate, or the like. Active regions are defined on semiconductor substrate 100 by element isolation regions 101. To form element isolation regions 101, trenches are formed in semiconductor substrate 100, the trenches are filled with an oxide film having an excellent filling property, and then the oxide film is planarized thereby, thus forming element isolation regions 101. In addition, N-type or P-type impurities (i.e., N-type or P-type impurity ions) may be implanted into semiconductor substrate 100 to form transistors having different conductivities, thereby forming well regions (not shown). Regions in which N-type transistors having a CMOS configuration are formed, and regions in which P-type transistors are formed are each formed in the peripheral circuit region. N-type or P-type impurities may be implanted (at a predetermined concentration) into the regions of the peripheral circuit region of semiconductor substrate 100 in which the transistors having different conductivities are formed.

Subsequently, gate electrode structures Ga are formed on the cell array region and the peripheral circuit region. Each gate electrode structure Ga comprises a preliminary gate electrode structure comprising a gate electrode 102/103 and a gate capping film 104. In addition, each gate electrode 102/103 comprises a first gate conductive film 102 and a second gate conductive film 103. Each gate electrode structure Ga further comprises first spacers 105 formed on the sidewalls of the preliminary gate electrode structure. As an example, in the embodiment illustrated in FIGS. 1 to 8, a plurality of gate electrode structures Ga may be formed by first forming a plurality of preliminary gate electrode structures. The plurality of preliminary gate electrode structures may be formed by sequentially forming a first conductive film, a second conductive film, and a capping film on a gate oxide film (not shown) formed on semiconductor substrate 100, and then patterning the first conductive film, the second conductive film, and the capping film through an ordinary patterning process (i.e., photoresist process). Thus, a plurality of preliminary gate electrode structures may be formed on the peripheral circuit region and the cell array region of semiconductor substrate 100, wherein each preliminary gate electrode structure comprises a first gate conductive film 102, a second gate conductive film 103, and a gate capping film 104. Each of first and second gate conductive films 102 and 103 may be a polysilicon film, a film formed from polysilicon having ion-implanted impurities, a metal conductive film, or a laminated film formed through laminating a polysilicon film and a silicide film. The metal conductive film may be formed from W, Co, Cr, TiN, TaN, NiTa; metal silicide of Ti, Co, Ni, or the like; or a combination thereof.

As an example, when each gate electrode 102/103 is a multilayer film, an ohmic film (not shown) formed from tungsten silicide (W silicide) and a barrier film (not shown) formed from tungsten nitride (WN) may be formed between the first conductive film and the second conductive film before performing the patterning process to form the preliminary gate electrode structures in order to reduce contact resistance and prevent the diffusion of conductive materials between first and second gate conductive films 102 and 103. The ohmic film and the barrier film may be formed, for example, by a conventional method such as a chemical vapor deposition (CVD) method or a physical vapor deposition (PVD) method.

In the embodiment illustrated in FIGS. 1 to 8, the gate oxide film may be formed from silicon oxide, formed through a high or low temperature thermal oxidation process, and formed to have a thickness in a range of about 50 to 60 Å. Further, first gate conductive film 102 may be formed from polysilicon, second gate conductive film 103 may be formed from tungsten, and gate capping film 104 may be formed from silicon nitride. First gate conductive film 102 may be formed to have a thickness of about 800 Å, the ohmic film and barrier film may each be formed to have a thickness of about 200 Å, second gate conductive film 103 may be formed to have a thickness of about 500 Å, gate capping film 104 may be formed to have a thickness of about 1500 Å, and each of those films may be formed through a conventional method such as a CVD method or a low pressure chemical vapor deposition (LPCVD) method. However, the respective thicknesses of the films are not limited to the thicknesses mentioned above.

Subsequently, first spacers 105 are formed on the sidewalls of preliminary gate electrode structures formed in the cell array region and the peripheral circuit region, wherein each preliminary gate electrode structure comprises a gate electrode 102/103 and a gate capping film 104. Thus, first spacers 105 are formed on sidewalls of gate electrodes 102/103 and gate capping films 104 formed in the cell array region and the peripheral circuit region of semiconductor substrate 100. To form first spacers 105, after the plurality of gate electrodes 102/103 and gate capping films 104 are formed on semiconductor substrate 100, a silicon nitride or silicon oxide film is formed on semiconductor substrate 100 by, for example, a CVD method, an atomic layer deposition (ALD) method, or a low pressure (LP) furnace method, and then the film is anisotropically etched through reactive ion etching. By forming first spacers 105 on the plurality of preliminary gate electrode structures formed in the cell array region and the peripheral circuit region of the semiconductor substrate 100, a plurality of gate electrode structures Ga is formed in the cell array region and the peripheral circuit region.

Figure 2:
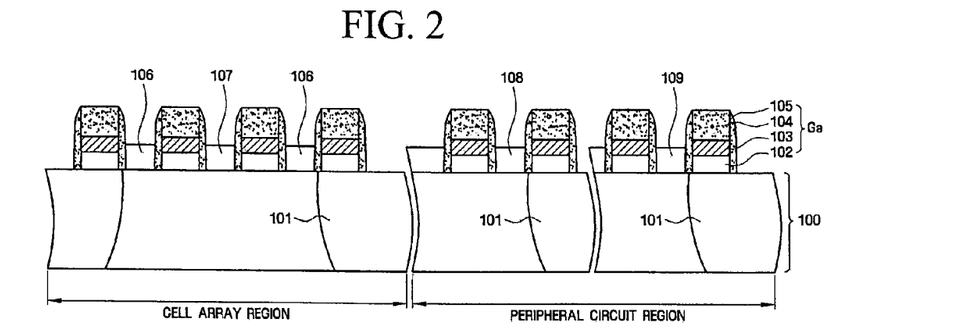

Then, as shown in FIG. 2, selective epitaxial films 106, 107, 108, and 109 are formed on active regions of semiconductor substrate 100 exposed between gate electrode structures Ga of the plurality of gate electrode structures Ga. A conventional selective epitaxial growth process may be performed to selectively form selective epitaxial films 106, 107, 108, and 109 on exposed active regions of semiconductor substrate 100. In the embodiment illustrated in FIGS. 1 to 8, the height of each selective epitaxial film is greater than the height of each first gate conductive film 102. For example, the height of each selective epitaxial film may be about 900 Å. However, the respective heights of the selective epitaxial films are not limited to being greater than the height of each first gate conductive film 102. Since each selective epitaxial film is formed on the surface of semiconductor substrate 100 with a predetermined thickness, it is possible to reduce the contact resistance of the semiconductor integrated circuit device and to improve an electrical characteristic(s) of the semiconductor integrated circuit device. Benefits of the selective epitaxial films formed having predetermined heights will also be described below with reference to the semiconductor integrated circuit device of FIG. 8. As used herein, both the "height" and the "thickness" of an element is the length of that element along a dimension that is substantially perpendicular to the working surface of the substrate on which it is formed. That is, the terms "height" and "thickness" may be used herein interchangeably.

In addition, after the process for forming gate electrodes 102/103 and gate capping films 104 (i.e., the plurality of preliminary gate electrode structures), but before a process for forming first spacers 105 and/or before performing a process for forming the selective epitaxial films, a process for implanting N-type or P-type impurities into semiconductor substrate 100 at a predetermined concentration in order to form transistors having different conductivities may be performed.

After forming the selective epitaxial films, impurities are implanted into selective epitaxial films 106, 107, 108, and 109 to form elevated source/drain regions, thereby forming transistors in the cell array region and the peripheral circuit region. Transistors having different conductivities may be formed by performing a conventional process(es) for implanting impurities. A process for implanting N-type impurities and a process for implanting P-type impurities may be independently performed in the peripheral circuit region to form a CMOS configuration. For example, using the following method, N-type impurities may be implanted into selective epitaxial films 106, 107, and 108, and then P-type impurities may be implanted into selective epitaxial film 109. First, a photoresist process is performed to form a first photoresist pattern (not shown) exposing selective epitaxial films 106, 107, and 108. Each of selective epitaxial films 106, 107, and 108 is disposed in a region in which N-type transistors are formed, and each is disposed in either the cell array region or the peripheral circuit region, as shown in FIG. 2. Next, while the first photoresist pattern and first spacers 105 are used as an ion implantation mask, N-type impurities are implanted into selective epitaxial films 106, 107, and 108. The first photoresist pattern is then removed. Subsequently, a photoresist process is performed to form a second photoresist pattern (not shown) exposing selective epitaxial film 109. Selective epitaxial film 109 is disposed in a region of the peripheral circuit region in which a P-type transistor is formed. Then, while the second photoresist pattern and first spacers 105 are used as an ion implantation mask, P-type impurities are implanted into selective epitaxial film 109. The second photoresist pattern is then removed. As a result, transistors having different conductivities are formed in the cell array region and the peripheral circuit region.

Figure 3:
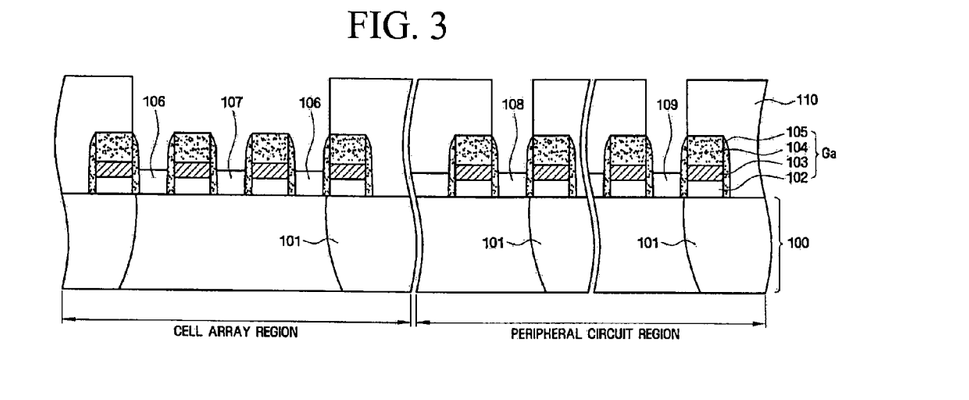

Next, as shown in FIG. 3, a first interlayer insulating film 110 is formed on the entire surface of semiconductor substrate 100, and then first interlayer insulating film 110 is patterned to form a plurality of first openings through which elevated source/drain regions (not shown) of the cell array region and the peripheral circuit region are exposed.

First interlayer insulating film 110 may be formed from, for example, Borosilicate Glass (BSG), PhosphoSilicate Glass (PSG), BoroPhosphoSilicate Glass (BPSG), Tetra Ethyl Ortho Silicate (TEOS), Fluoride Silicate Glass (FSG), or the like. In addition, first interlayer insulating film 110 may be formed through a deposition method, such as a CVD method, a plasma enhanced CVD (PECVD) method, a low pressure CVD (LPCVD) method, or an atmospheric pressure CVD (APCVD) method. Further, first interlayer insulating film 110 may be formed to have one of various thicknesses depending on a characteristic(s) of the semiconductor device.

As mentioned above, after first interlayer insulating film 110 is formed, an patterning process (i.e., a photoresist process) is performed to etch first interlayer insulating film 110 to thereby form the plurality of first openings through which elevated source and drain regions 106, 107, 108, and 109 of the cell array region and the peripheral circuit region are exposed. Although not shown in separate drawings, in the embodiment illustrated in FIGS. 1 to 8, after the plurality of first openings are formed, a process that is substantially the same process as the process for forming first spacers 105 is performed in order to form second spacers on first spacers 105. The second spacers are formed because first spacers 105 are partially etched when first interlayer insulating film 110 is etched. Since the formation of second spacers compensates for the reduction in the respective thicknesses of first spacers 105, it is possible to substantially prevent electrical short-circuiting between self-aligned contact pads (formed subsequently) and first and second gate conductive films 102 and 103.

Subsequently, a process such as chemical mechanical polishing (CMP) is performed to reduce the height of first interlayer insulating film 110 so that first interlayer insulating film 110 has the same height as a gate capping film 104 of gate electrode structure Ga.

Figure 4:
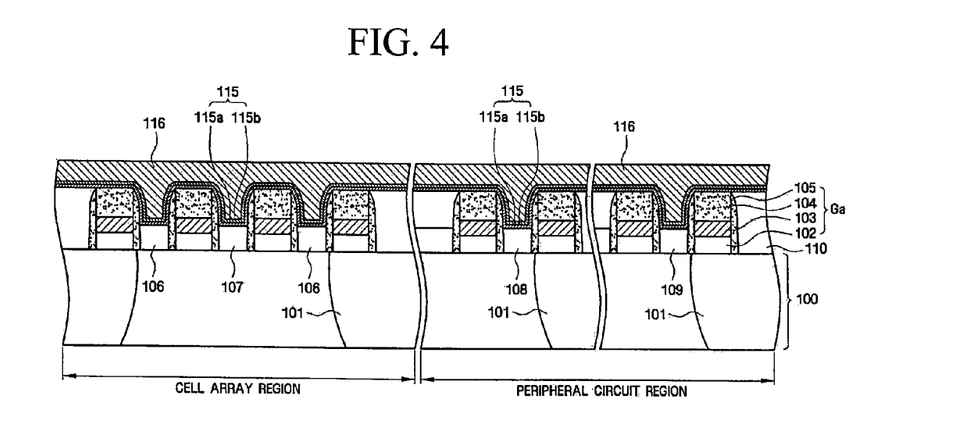

Next, as shown in FIG. 4, a first ohmic film 115*a*, a first barrier film 115*b*, and a metal film 116 are sequentially formed on the elevated source/drain regions exposed through the plurality of first openings. First ohmic film 115*a*, first barrier film 115b, and metal film 116 may be formed through a conventional method, such as a CVD method or a PVD method. First ohmic film 115a may be formed from, for example, metal silicide of Ti, Co, W, Ni, or the like. The metal silicide is formed on selective epitaxial films 106, 107, 108, and 109 in which source/drain regions are formed. As a result, it is possible to reduce the contact resistance between self-aligned contact pads (formed subsequently) and the metal silicide. First barrier film 115b may comprise, for example, WN, TiN, TaN, BN, MoN, CoN, or the like. First barrier film 115b serves as a diffusion barrier. In addition, metal film 116 may comprise, for example, W, TiN, or Al.

Figure 5:
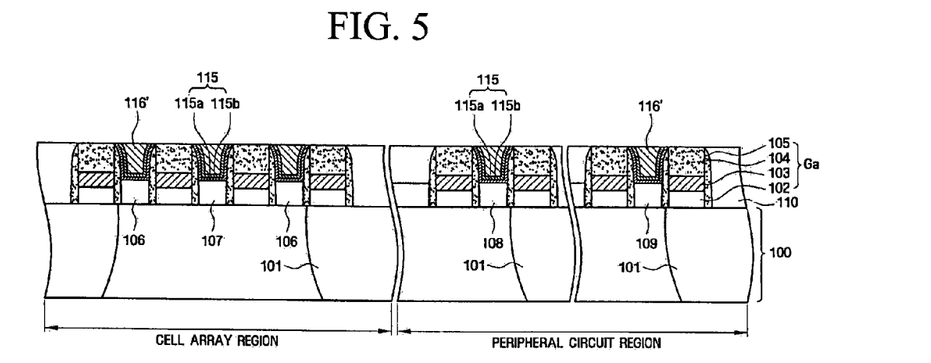

Subsequently, as shown in FIG. 5, portions of metal film 116, first barrier film 115b, and first ohmic film 115a are removed to form self-aligned contact pads 116', which are node-isolated. A conventional process such as CMP, dry etching, or wet etching is performed to remove portions of metal film 116, first barrier film 115b, and first ohmic film 115a to expose upper surfaces of gate capping films 104. Accordingly, it is possible to achieve node-isolation. As a result, it is possible to form a plurality of self-aligned contact pads in the cell array region and the peripheral circuit region.

In related art, a process for forming contacts in the peripheral circuit region and a process for forming self-aligned contact pads in the cell array region have been performed independently, so the overall process for forming those contacts is relatively complicated. However, in accordance with at least one embodiment of the invention, as design rules have been reduced, contacts disposed in the peripheral circuit region and self-aligned contact pads disposed in the cell array region can be formed simultaneously and through the same process. As a result, it is possible to simplify a process for forming contacts in the cell array region and the peripheral circuit region, in accordance with at least one embodiment of the invention. Further, forming self-aligned contacts substantially solves the problems of difficulty acquiring the open margins required for the formation of contacts and the increase in contact resistance that can occur due to the reduction of the design rule for the peripheral circuit region. In addition, since the contacts are formed from metal, as opposed to polysilicon, a process for implanting impurities does not need to be performed in order to give the transistors different conductivities after the formation of the contacts. As a result, it is possible to simplify the process for forming contacts in the cell array region and a peripheral circuit region.

Figure 6:
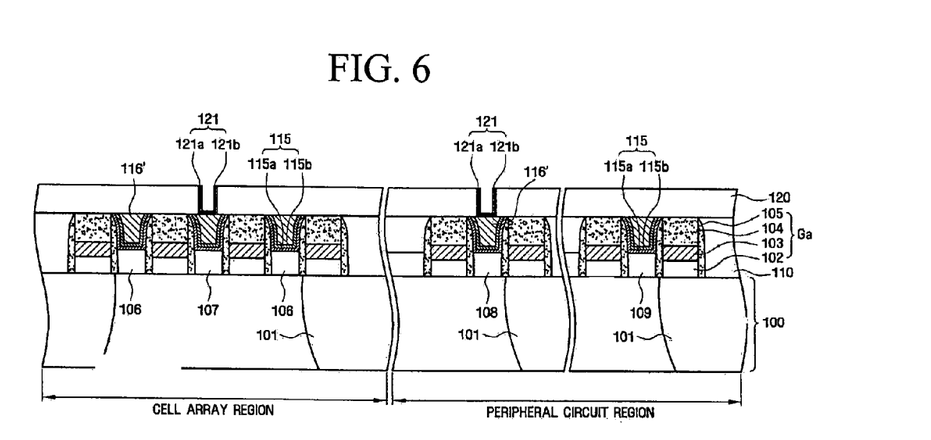

Next, as shown in FIG. 6, a second interlayer insulating film 120 covering the plurality of gate electrode structures Ga and the upper surfaces of self-aligned contact pads 116' is formed, and second interlayer insulating film 120 is then patterned to form a plurality of second openings exposing upper surfaces (i.e., portions of upper surfaces, see FIG. 6) of selected self-aligned contact pads 116' disposed in the cell array region and the peripheral circuit region. Second interlayer insulating film 120 can be formed through substantially the same process as the process described above for forming first interlayer insulating film 110, and the plurality of second openings can be formed through a patterning process (i.e., a photoresist process). Although not shown in separate drawings, in the embodiment illustrated in FIGS. 1 to 8, a plurality of third openings exposing upper surfaces of several miscellaneous gate electrode structures, wherein each miscellaneous gate electrode structure is disposed in one of a plurality of miscellaneous regions of semiconductor substrate 100, are formed at the same time as the plurality of second openings exposing upper surfaces of self-aligned contact pads 116'. As used herein, a "miscellaneous region" is a region of semiconductor substrate 100 that is neither the cell array region, nor the peripheral circuit region, and a "miscellaneous gate electrode structure" is a gate electrode structure disposed in a miscellaneous region, i.e., not disposed in the cell array region or a peripheral circuit region.

When the second and third openings are formed at the same time, second interlayer insulating film 120 can be etched even though the etching selectivity between second interlayer insulating film 120 and gate capping films 104 formed on gate electrodes 102/103 may be relatively high (i.e., second interlayer insulating film 120 may be readily etched relative to gate capping films 104) or second interlayer insulating film 120 and gate capping films 104 may be etched at substantially the same rate.

A second ohmic film 121a and a second barrier film 121b may be formed on the upper surfaces of the exposed self-aligned contact pads 116' and/or the upper surfaces of the miscellaneous gate electrode structures that are at least partially exposed by the third openings. Second ohmic film 121a can be formed by substantially the same process as the process for forming first ohmic film 115a. Second ohmic film 121a may be formed from, for example, metal silicide of Ti, Co, W, Ni, or the like. Further, second barrier film 121b may comprise, for example, WN, TiN, TaN, BN, MoN, CoN, or the like.

Figure 7:
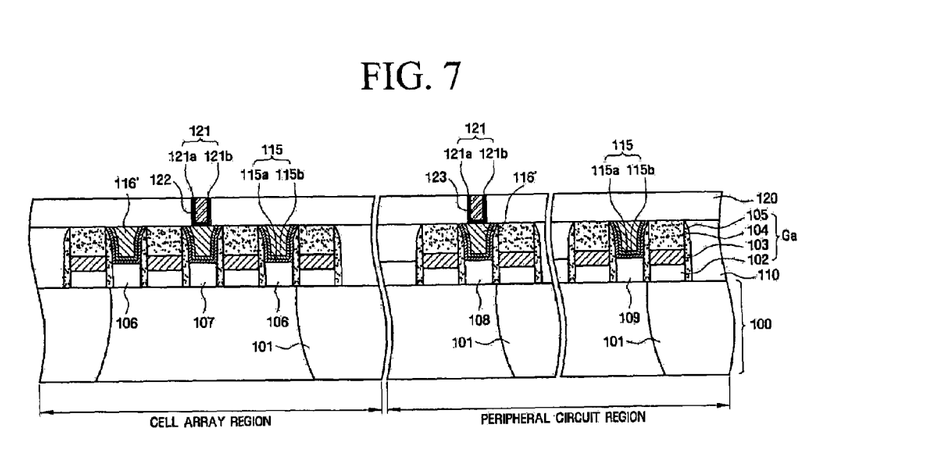

Subsequently, as shown in FIG. 7, the plurality of second openings formed in second interlayer insulating film 120 are filled with a metal material to form contact plugs 122 and 123. The second openings are filled with the metal material through a conventional method such as a CVD method or the like, and the metal material is then planarized using, for example, a CVD method to form contact plugs 122 and 123. Further, the same process described above for forming contact plugs 122 and 123 can be performed to form contact plugs in the third openings, which expose miscellaneous gate electrode structures. Contact plugs 122 and 123 and the contact plugs formed in the third openings may comprise W, TiN, Al, or the like. In accordance with the embodiment illustrated in FIGS. 1 to 8, contact plugs, which are formed in the cell array region and the peripheral circuit region and are connected to a metal wire, can be formed through the same process at the same time. Therefore, it is possible to simplify the process for forming contact plugs in the cell array region and the peripheral circuit region.

Figure 8:
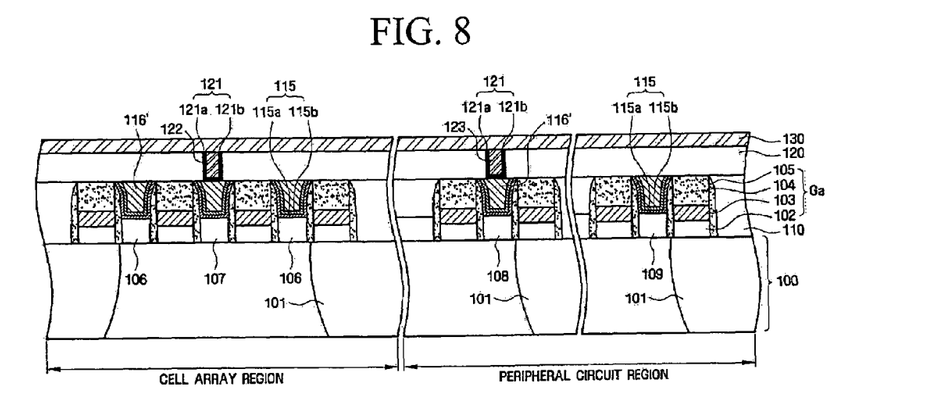

Next, as shown in FIG. 8, a metal wire 130 is formed on second interlayer insulating film 120 and contact plugs 122 and 123. In forming metal wire 130, a metal film is formed on second interlayer insulating film 120 and contact plugs 122 and 123 through, for example, CVD or the like. Then, the metal film is patterned to form metal wire 130. Metal wire 130 may comprise, for example, W, TiN, Al, or the like.

Figure 9:
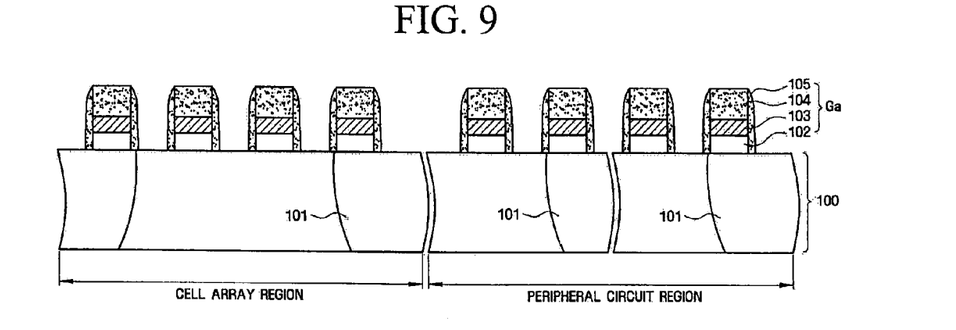
FIGS. 9 to 11 are cross-sectional views illustrating a method for fabricating a semiconductor integrated circuit device in accordance with another embodiment of the invention.
Figure 10:
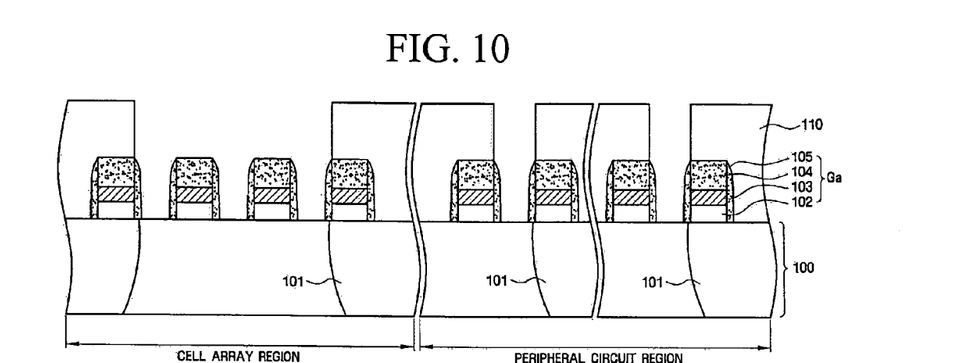
Figure 11:
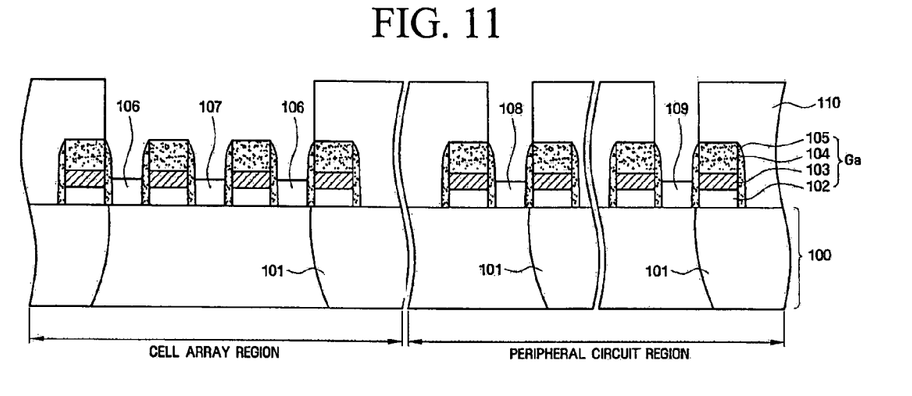

FIGS. 9 to 11 are cross-sectional views illustrating a method for fabricating a semiconductor integrated circuit device having substantially the same configuration as the device illustrated in FIG. 8, in accordance with another embodiment of the invention.

As shown in FIG. 9, a semiconductor substrate 100 comprises a cell array region and a peripheral circuit region. In addition, a plurality of gate electrode structures Ga is formed on the cell array region and the peripheral circuit region. To form the plurality of gate electrode structures Ga, a plurality of preliminary gate electrode structures, each comprising a gate electrode 102/103 and a gate capping film 104, are formed, and first spacers 105 are then formed on the sidewalls of the preliminary gate electrode structures (i.e., on the sidewalls of gate electrodes 102/103 and gate capping films 104). Since the processes for forming gate electrode structures Ga are substantially the same as the corresponding processes described with reference to FIG. 1, further description thereof will be omitted here. In addition, after a process for forming first spacers 105 and/or after a process for forming gate electrodes 102/103 and gate capping films 104, a process for implanting N-type or P-type impurities into semiconductor substrate 100 at a predetermined concentration to form transistors having different conductivities may be performed.

Then, as shown in FIG. 10, a first interlayer insulating film 110 is formed on the entire surface of semiconductor substrate 100, and first interlayer insulating film 110 is patterned to form a plurality of first openings exposing the cell array region and the peripheral circuit region of semiconductor substrate 100. Since the processes for forming and patterning first interlayer insulating film 110 are substantially the same as the corresponding processes described with reference to FIG. 3, further description of those processes will be omitted here. In addition, in accordance with the embodiment illustrated in FIGS. 9 to 11, after forming the plurality of first openings, a process for implanting N-type or P-type impurities (at a predetermined concentration) into regions of semiconductor substrate 100 exposed by the plurality of first openings, and in which the transistors having different conductivities are formed, may be performed on semiconductor substrate 100. When first interlayer insulating film 110 is etched (i.e., patterned to form the plurality of first openings), upper regions of semiconductor substrate 100 into which N-type or P-type impurities have been implanted at a predetermined concentration are partially etched. As a result, N-type or P-type impurity regions may be lost. Therefore, the process for implanting N-type or P-type impurities is performed to substantially remedy the damage that was done (i.e., to compensate for the regions that were lost).

As shown in FIG. 11, selective epitaxial films 106, 107, 108, and 109 are formed on portions of semiconductor substrate 100 that are exposed through the plurality of first openings described with reference to FIG. 10, and impurities are implanted into selective epitaxial films 106, 107, 108, and 109 to form elevated source/drain regions, thereby forming transistors in the cell array region and the peripheral circuit region. Although selective epitaxial films 106, 107, 108, and 109 are formed in the plurality of first openings in first interlayer insulating layer film 110 in the embodiment illustrated in FIGS. 9 to 11, the processes for forming selective epitaxial films 106, 107, 108, and 109 and implanting impurities into selective epitaxial films 106, 107, 108, and 109 in the embodiment illustrated in FIGS. 9 to 11 are substantially the same as the corresponding processes described with reference to FIG. 2, so further description of those processes will be omitted here.

In the embodiment illustrated in FIGS. 9 to 11, the elevated source/drain regions of the cell array region and the peripheral circuit region are exposed through the plurality of first openings. After the elevated source/drain regions are formed, a process that is substantially the same as the process for forming first spacers 105 may be performed in order to form second spacers (not shown) on first spacers 105. Subsequently, a first ohmic film 115a, a first barrier film 115b, and a metal film 116 are sequentially formed on the elevated source/drain regions. Next, portions of metal film 116, first barrier film 115b, and first ohmic film 115a are removed to form a plurality of self-aligned contact pads 116' that are node-isolated. Since these processes are substantially the same as the corresponding processes described with reference to FIGS. 4 and 5, further descriptions of these processes will be omitted here.

Subsequently, processes for forming contact plugs 122 and 123 and a metal wire 130 on semiconductor substrate 100 that are substantially the same as the corresponding processes described with reference to FIGS. 6 to 8 are performed in order to form a semiconductor integrated circuit device having substantially the same configuration as the device shown in FIG. 8.

Subsequently, a process for forming wires used to input/output electrical signals to/from transistors disposed in the cell array region and the peripheral circuit region by processes widely known to those skilled in the art, a process for forming a passivation layer on the substrate, and a process for packaging the substrate are additionally performed in order to complete the semiconductor integrated circuit device.

FIG. 8 shows a semiconductor integrated circuit device in accordance with an embodiment of the invention. The semiconductor integrated circuit device of FIG. 8 will be described below. Further, elements of the semiconductor integrated circuit device of FIG. 8 that were described above (in relation to the methods for fabricating a semiconductor integrated circuit device in accordance with embodiments of the invention) will either not described again here, or will be described here only briefly, in order to avoid excessive repetition.

As shown in FIG. 8, semiconductor substrate 100 comprises a cell array region and a peripheral circuit region, and may comprise active regions defined by element isolation regions 101. Further, semiconductor substrate 100 may comprise well regions (not shown), and impurity regions (not shown) having different conductivities. The well regions are formed by implanting N-type or P-type impurities into semiconductor substrate 100 to form transistors having different conductivities. The impurity regions are formed while a plurality of gate electrodes 102/103, gate capping films 104, and first spacers 105 are used as an ion implantation mask.

A plurality of gate electrode structures Ga may be disposed on portions of semiconductor substrate 100 corresponding to the cell array region and the peripheral circuit region, and a gap having a predetermined width may be disposed between each pair of adjacent gate electrode structures Ga. Each gap may be the same width as first gate conductive film 102, for example. Further, the plurality of gate electrode structures Ga may be arranged along a predetermined direction, for example, a direction perpendicular to the plane of FIG. 8 (i.e., a direction that extends perpendicularly into FIG. 8). Each of gate electrode structures Ga comprises a first gate conductive film 102, a second gate conductive film 103, a gate capping film 104, and first spacers 105. Gate capping film 104 may be disposed on first and second gate conductive films 102 and 103, and first spacers 105 are disposed on sidewalls of gate electrodes 102/103 and gate capping films 104. Each gate electrode 102/103 may have a multilayer configuration comprising metal conductive films formed from, for example, polysilicon and/or W. In addition, for example, an ohmic film (not shown) formed from tungsten silicide and a barrier film (not shown) formed from tungsten nitride may be interposed between first gate conductive film 102 and second gate conductive film 103. Also, second spacers (not shown) may be formed on first spacers 105. As used herein, the term "width" indicates a distance (or, for an element, a size of that element) along a dimension substantially parallel to the working surface of the corresponding substrate.

In addition, selective epitaxial films 106, 107, 108, and 109 are disposed on semiconductor substrate 100 between adjacent gate electrode structures Ga and each have a predetermined height. An elevated source/drain region is disposed in each of selective epitaxial films 106, 107, 108, and 109, and each elevated source/drain region comprises an impurity region having a predetermined concentration of impurities. In addition, the elevated source/drain regions may have different conductivities. As design rules have been reduced, elevated source/drain regions may also be disposed in the peripheral circuit region. Therefore, it is possible to improve an electrical characteristic(s) (for example, a leakage current characteristic) of the semiconductor integrated circuit device illustrated in FIG. 8. The respective heights of selective epitaxial films 106,107, 108, and 109 may be greater than the height of each first gate conductive film 102, for example, but the respective heights of selective epitaxial films 106,107,108, and 109 are not limited to being greater than the height of each first gate conductive film 102. When selective epitaxial films 106, 107, 108, and 109 are formed having a predetermined height in order to form elevated source/drain regions, the source/drain regions are disposed on semiconductor substrate 100. Accordingly, the negative effects of a short channel effect that can occur due to an increase in the degree of integration of a semiconductor integrated circuit device (for example, a punch-through phenomenon) may be reduced. Furthermore, if the selective epitaxial films are formed such that the upper surfaces of the selective epitaxial films are disposed relatively high above the surface of the semiconductor substrate and are formed such that their respective heights are greater than the heights of gate conductive films 102, the negative effects of a facet phenomenon may be reduced. As a result, it is possible to implant impurities into the selective epitaxial films at a high concentration. In addition, since it is possible to implant impurities into the selective epitaxial films at a high concentration, it is possible to reduce the contact resistance between the semiconductor substrate and the contacts.

First ohmic film 105a is disposed on selective epitaxial films 106, 107, 108, and 109, and first barrier film 105b is disposed on first ohmic film 105a. First ohmic film 105a may comprise, for example, metal silicide of Ti, Co, W, Ni, or the like. First barrier film 105b may comprise, for example, WN, TiN, TaN, BN, MoN, CoN, or the like.

Self-aligned contact pads 116' are disposed on selective epitaxial films 106, 107, 108, and 109, and are formed in the cell array region and the peripheral circuit region. Self-aligned contact pads 116' may comprise, for example, W, TiN, Al, or the like. In the embodiment illustrated in FIG. 8, the self-aligned contact pad 116' disposed on selective epitaxial film 106 in the cell array region may be connected to, for example, a storage node (not shown). Further, the self-aligned contact pad 116' disposed on selective epitaxial film 107 may be connected to, for example, metal wire 130. In addition, the self-aligned contact pad 116' disposed on selective epitaxial film 108 in the peripheral circuit region may be connected to, for example, a metal wire (not shown). As the degree of integration of the semiconductor integrated circuit device has increased, it has become possible, for example, to form a contact pad 116' (i.e., the lower end of the contact connected to metal wire 130) in the peripheral circuit region through a self-alignment method. Therefore, a process for forming self-aligned contacts in the cell array region is not performed separately from a process for forming self-aligned contacts in the peripheral circuit region, but rather self-aligned contacts are formed in both the cell array region and the peripheral circuit region through the same process at the same time. As a result, it is possible to simplify the process for forming contacts.

Second interlayer insulating film 120 is disposed on first interlayer insulating film 110 and comprises second openings disposed on upper surfaces of several self-aligned contact pads 116'. Further, second interlayer insulating film 120 may comprise third openings (not shown) disposed on upper surfaces of miscellaneous gate electrode structures formed in miscellaneous regions of semiconductor substrate 100. Second ohmic film 121a and second barrier film 121b are disposed in the plurality of second openings and may also be disposed in the plurality of third openings. When referring to a device, such as the one illustrated in FIG. 8, an "opening" in a film means a region within the outermost boundaries of the film at which that film is not present. Thus, an opening need not be literally "open", but may be filled with other elements (such as other films) while remaining an "opening", as used herein.

Contact plugs 122 and 123 are formed in the plurality of second openings formed in second interlayer insulating film 120. In addition, contact plugs (not shown) may be formed in the third openings (not shown) disposed on upper surfaces of miscellaneous gate electrode structures formed in miscellaneous regions of semiconductor substrate 100.

In addition, metal wire 130 is disposed on upper surfaces of second interlayer insulating film 120 and contact plugs 122 and 123.

In accordance with a method for fabricating a semiconductor integrated circuit device, in accordance with embodiments of the invention, the lower end of a contact connected to a metal wire and disposed in a peripheral circuit region can be formed through the same process as a process for forming self-aligned contacts in the cell region and can be formed at the same time as the self-aligned contacts. Therefore, it is possible to simplify a process for fabricating a semiconductor integrated circuit device. In addition, since a selective epitaxial film is formed having a predetermined height (i.e., since an upper surface of the selective epitaxial film is disposed above an upper surface of a semiconductor substrate by a predetermined distance), it is possible to reduce the contact resistance of the semiconductor integrated circuit device and to improve an electrical characteristic(s) of the semiconductor integrated circuit device.

Although embodiments of the invention have been described herein, various modifications and changes may be made to the embodiments by those skilled in the art without departing from the scope of the invention as defined by the accompanying claims.

What is claimed is:

1. A method for fabricating a semiconductor integrated circuit device, the method comprising:

forming a plurality of preliminary gate electrode structures in a cell array region and a peripheral circuit region of a semiconductor substrate, wherein each preliminary gate electrode structure comprises a gate electrode and a gate capping film formed on the gate electrode;

forming first spacers on sidewalls of the preliminary gate electrode structures;

forming selective epitaxial films on the semiconductor substrate in the cell array region and the peripheral region, wherein each selective epitaxial film is formed on a region of the semiconductor substrate exposed between gate electrodes;

implanting impurities into at least some of the selective epitaxial films to form elevated source/drain regions in the cell array region and the peripheral circuit region, thereby forming transistors in the cell array region and the peripheral circuit region;

forming a first interlayer insulating film on the semiconductor substrate;

patterning the first interlayer insulating film to form a plurality of first openings exposing the elevated source/drain regions and self-aligned between gate electrodes;

forming a first ohmic film on the elevated source/drain regions exposed through the first openings;

forming a first barrier film on the first ohmic film;

forming a metal film on the first barrier film; and removing a first portion of the metal film, a first portion of the first barrier film, and a first portion of the first ohmic film to form a plurality of self-aligned contact pads, wherein each self-aligned contact pad is node-isolated and the first portion of the metal film comprises at least one second portion of the metal film disposed on at least one of the gate capping films.

2. The method of claim 1, wherein forming the preliminary gate electrode structures comprises:

sequentially forming a polysilicon film, a second ohmic film, a second barrier film, a tungsten film, and a capping film; and sequentially patterning the capping film, the tungsten film, the second barrier film, the second ohmic film, and the polysilicon film.

3. The method of claim 2, wherein:

each gate electrode comprises a gate polysilicon film; and an upper surface of each selective epitaxial film is disposed higher than an upper surface of at least one of the gate polysilicon films.

4. The method of claim 1, wherein:

the first openings expose at least some of the first spacers; and the method further comprises, before forming the first ohmic film, forming one of a plurality of second spacers on each of the first spacers of the at least some of the first spacers exposed by the first openings.

5. The method of claim 1, wherein the first ohmic film is formed from a metal silicide.

6. The method of claim 5, wherein the metal silicide is a silicide of Ti, Co, W, or Ni.

7. The method of claim 1, wherein the first barrier film is formed from WN, TiN, TaN, BN, MoN, or CoN.

8. The method of claim 1, wherein the metal film is formed from W, TiN, or Al.

9. The method of claim 1, wherein the method further comprises, after forming the plurality of self-aligned contact pads:

forming a second interlayer insulating film on the gate electrodes and the plurality of self-aligned contact pads;

patterning the second interlayer insulating film to form a plurality of second openings exposing upper surfaces of at least some of the self-aligned contact pads, wherein the second openings expose at least one self-aligned contact pad disposed in the cell array region and expose at least one self-aligned contact pad disposed in the peripheral circuit region;

filling the second openings with a metal material to form a plurality of contact plugs; and forming a metal wire on the second interlayer insulating film and the plurality of contact plugs.

10. The method of claim 9, wherein forming the plurality of second openings further comprises forming a plurality of third openings exposing upper surfaces of a plurality of miscellaneous gate electrode structures, wherein each miscellaneous gate electrode structure is formed in one of at least one miscellaneous region of the semiconductor substrate.

11. The method of claim 9, wherein the contact plugs are formed from W, TiN, or Al.

12. The method of claim 9, further comprising forming a second ohmic film and a second barrier film on the self-aligned contact pads exposed by the second openings before forming the plurality of contact plugs.

13. The method of claim 12, wherein the second ohmic film is formed from metal silicide.

14. The method of claim 13, wherein the metal silicide is metal silicide of Ti, Co, W, or Ni.

15. The method of claim 12, wherein the second barrier film is formed from WN, TiN, TaN, BN, MoN, or CoN.

* * * * *